United States Patent
Gupta et al.

(10) Patent No.: US 11,763,880 B2
(45) Date of Patent: Sep. 19, 2023

(54) COLUMN MULTIPLEXER CIRCUITRY

(71) Applicant: Arm Limited, Cambridge (GB)

(72) Inventors: Lalit Gupta, Cupertino, CA (US);
Fakhruddin Ali Bohra, San Jose, CA (US); Shri Sagar Dwivedi, San Jose, CA (US); Vidit Babbar, Bangalore (IN)

(73) Assignee: Arm Limited, Cambridge (GB)

( * ) Notice: Subject to any disclaimer, the term of this patent is extended or adjusted under 35 U.S.C. 154(b) by 116 days.

(21) Appl. No.: 16/990,951

(22) Filed: Aug. 11, 2020

(65) Prior Publication Data
US 2021/0304816 A1 Sep. 30, 2021

(30) Foreign Application Priority Data
Mar. 30, 2020 (IN) .............................. 202041013913

(51) Int. Cl.
*G11C 11/418* (2006.01)
*G11C 11/419* (2006.01)

(52) U.S. Cl.
CPC .......... *G11C 11/418* (2013.01); *G11C 11/419* (2013.01)

(58) Field of Classification Search
CPC ............ G11C 11/4091; G11C 11/2255; G11C 11/2253; G11C 11/1655; G11C 11/1653; G11C 11/1418; G11C 11/419
USPC ....................................................... 365/154
See application file for complete search history.

(56) References Cited

U.S. PATENT DOCUMENTS

| | | | | |
|---|---|---|---|---|
| 5,416,743 A * | 5/1995 | Allan | ................... | G11C 7/1048 365/189.08 |
| 5,663,905 A * | 9/1997 | Matsuo | ................. | G11C 11/005 365/230.02 |
| 5,666,324 A * | 9/1997 | Kosugi | ..................... | G11C 7/22 365/233.5 |
| 6,608,797 B1 * | 8/2003 | Parris | ................... | G11C 7/1048 365/194 |
| 8,675,434 B1 * | 3/2014 | Whately | ............... | G11C 11/419 365/205 |
| 2004/0037140 A1 * | 2/2004 | Kang | .................. | G11C 11/4097 365/205 |
| 2004/0051121 A1 * | 3/2004 | Sugiyama | ................ | G11C 7/12 257/202 |
| 2014/0268975 A1 * | 9/2014 | Kitagawa | ................. | G11C 7/18 365/63 |
| 2014/0328118 A1 * | 11/2014 | Hoya | ................... | G11C 11/1675 365/158 |
| 2015/0033089 A1 * | 1/2015 | Cho | ........................ | G11C 29/40 714/731 |

(Continued)

Primary Examiner — Sung Il Cho
(74) *Attorney, Agent, or Firm* — Pramudji Law Group PLLC; Ari Pramudji

(57) ABSTRACT

Various implementations described herein are related to a device having memory architecture having multiple bitcell arrays. The device may include column multiplexer circuitry coupled to the memory architecture via multiple bitlines for read access operations. The column multiplexer circuitry may perform read access operations in the multiple bitcell arrays via the bitlines based on a sense amplifier enable signal and a read multiplexer signal. The device may include control circuitry that provides the read multiplexer signal to the column multiplexer circuitry based on a clock signal and the sense amplifier enable signal so that the column multiplexer circuitry is able to perform the read access operations.

16 Claims, 10 Drawing Sheets

(56) References Cited

U.S. PATENT DOCUMENTS

2016/0086646 A1\* 3/2016 Hoya .................. G11C 11/1693
365/158
2020/0388327 A1\* 12/2020 Nguyen ................ G11C 11/417

\* cited by examiner

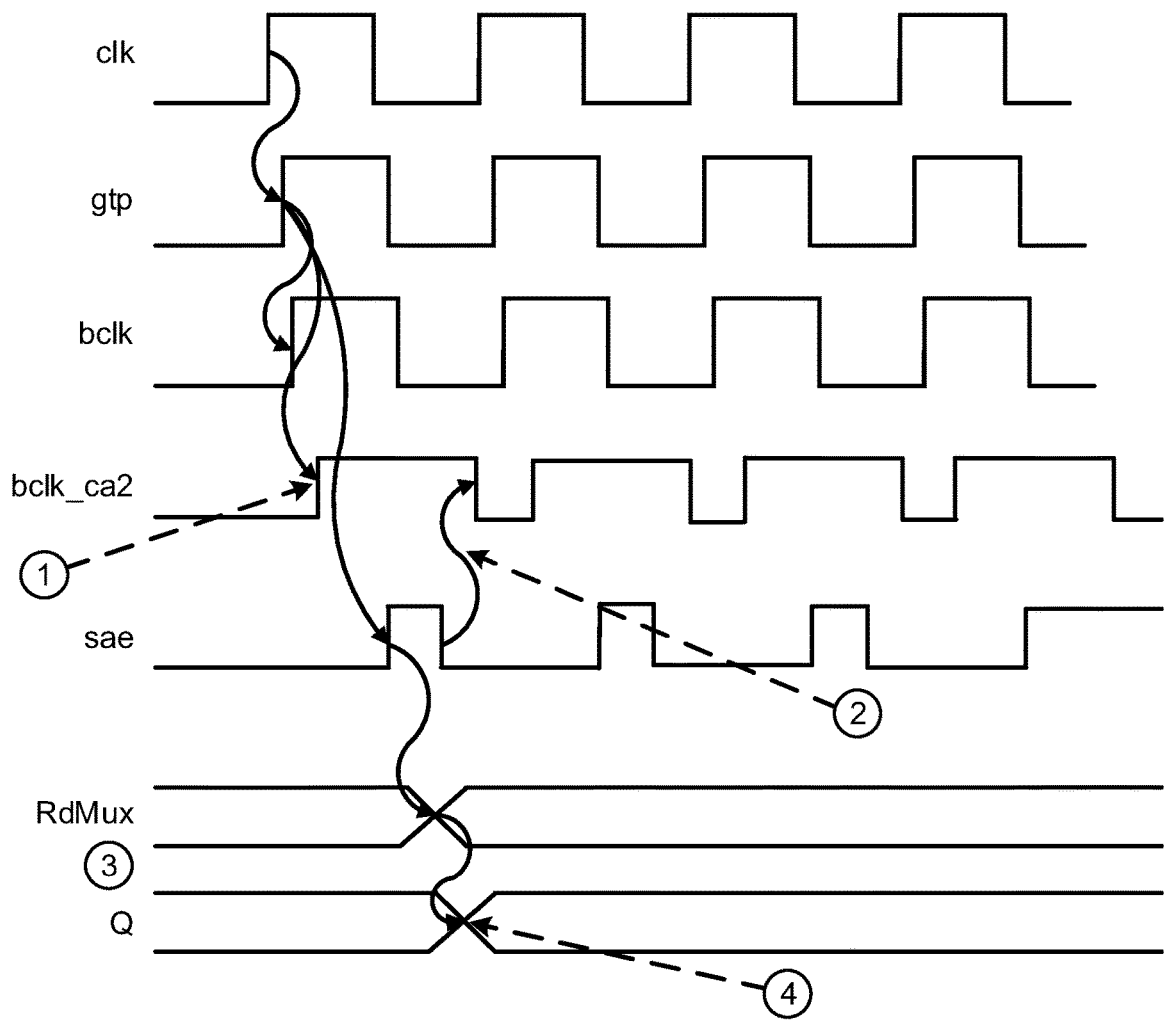

① This will ensure that there is no impact on ca[2] hold time as the rising edge will be controlled through gtp.

② This will ensure that the ph2 latch opens when the ph1 latch closes to thereby ensure that there is no ihold violation.

③ The ph1 latch will open when sae goes high, and the ph1 latch will close when sae goes low.

④ Q toggling will be controlled through sae gating of the ph1 flop, which will ensure that RdMux does not toggle before sae arrives, which simplifies the logic and saves power and timing at the SoC level.

Multi-Bank Memory Circuitry 502

| 4th Wordline Driver Circuitry 524B (WLD Upper Bank_3) | |
|---|---|
| 2nd Control Circuitry 526B (CTRL Upper Bank_2, Upper Bank_3) | 2nd Memory Array 504B (Upper Bank_2, Upper Bank_3) |
| 2nd Multiplexer Circuitry 528B (MUX Upper Bank_2, Upper Bank_3) | |
| 3rd Wordline Driver Circuitry 524A (WLD Upper Bank_2) | |
| 2nd Wordline Driver Circuitry 522B (WLD Lower Bank_1) | |
| 1st Control Circuitry 526A (CTRL Lower Bank_0, Lower Bank_1) | 1st Memory Array 504A (Lower Bank_0, Lower Bank_1) |
| 1st Multiplexer Circuitry 528A (MUX Lower Bank_0, Lower Bank_1) | |
| 1st Wordline Driver Circuitry 522A (WLD Lower Bank_0) | |
| Multi-Bank Control Circuitry 516 (SAE Mixed, Bank MUX Select) | Multi-Bank Output Multiplexer 532A | Multi-Bank Output Multiplexer 532B |

FIG. 5

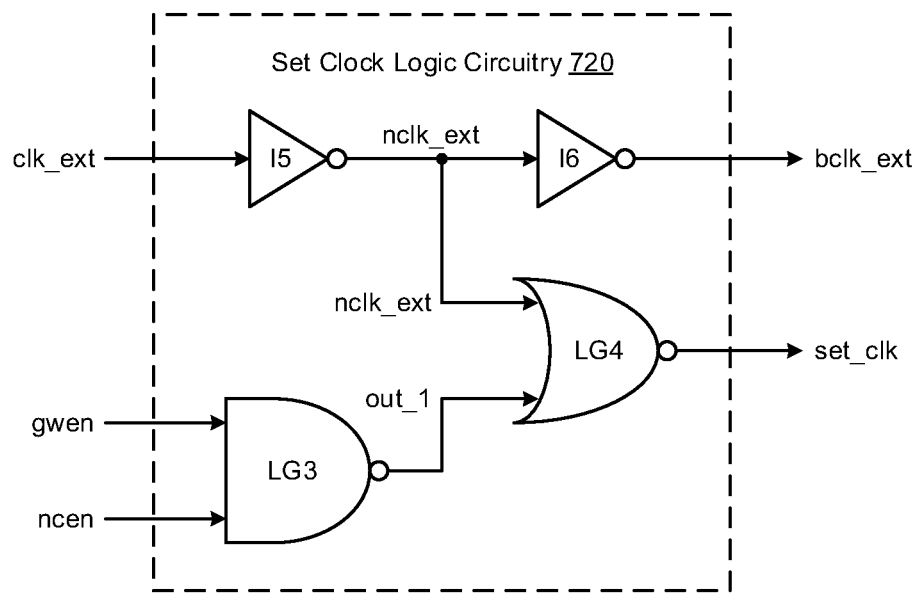
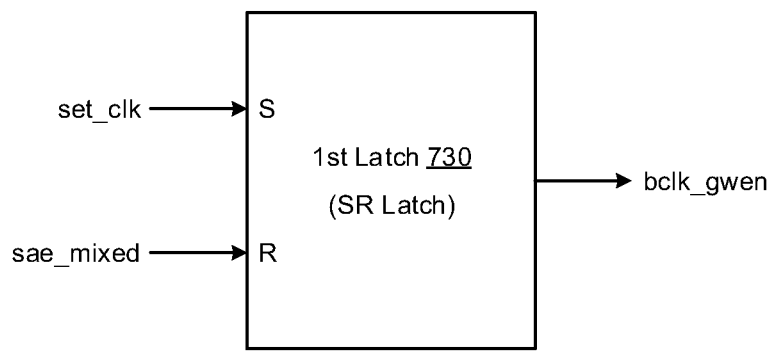
FIG. 7A

COLUMN MULTIPLEXER CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some conventional memory designs, extra multiplexers are used in the data output path to select data from different column multiplexers or to select data from different memory banks, which often causes delays in data output. Due to additional timing delays, buffers are typically used for clocking the data output paths for timing convergence. When a designer implements a memory instance at chip level, additional buffers in the data path can cause excessive timing delays due to hold constraints from data retention delays of the memory, and the additional buffers also increases on-chip area consumption. Thus, there exists a need to improve physical design implementation of some memory circuitry to thereby provide for more efficient column multiplexing operations.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 4 illustrates a waveform diagram of multiplexer timing in accordance with various implementations described herein.

FIG. 5 illustrates a diagram of multi-bank memory circuitry in accordance with various implementations described herein.

FIGS. 7A-7B illustrate various diagrams of control logic circuitry in accordance with various implementations described herein.

DETAILED DESCRIPTION

Various implementations described herein are directed to column multiplexing schemes and techniques that may improve memory access operations in various physical memory layout designs. For instance, various schemes and techniques described herein may provide for a system or a device having a unique memory architecture that matches retention delay with clock-to-data output (CLK2Q) delay for mux-8, mux-16 and multi-bank memory applications. In some instances, the memory architecture may include multiple bitcell arrays, column multiplexer circuitry and control circuitry. The column multiplexer circuitry may be coupled to the memory architecture via multiple bitlines for read access operations, and the column multiplexer circuitry may perform read access operations in the multiple bitcell arrays via the bitlines based on a sense amplifier enable signal and a read multiplexer signal. The control circuitry may provide the read multiplexer signal to the column multiplexer circuitry based on a clock signal and the sense amplifier enable signal so that the column multiplexer circuitry performs read access operations.

Various implementations of column multiplexing schemes and techniques will be described in detail herein with reference to FIGS. 1-8.

Figure 1:
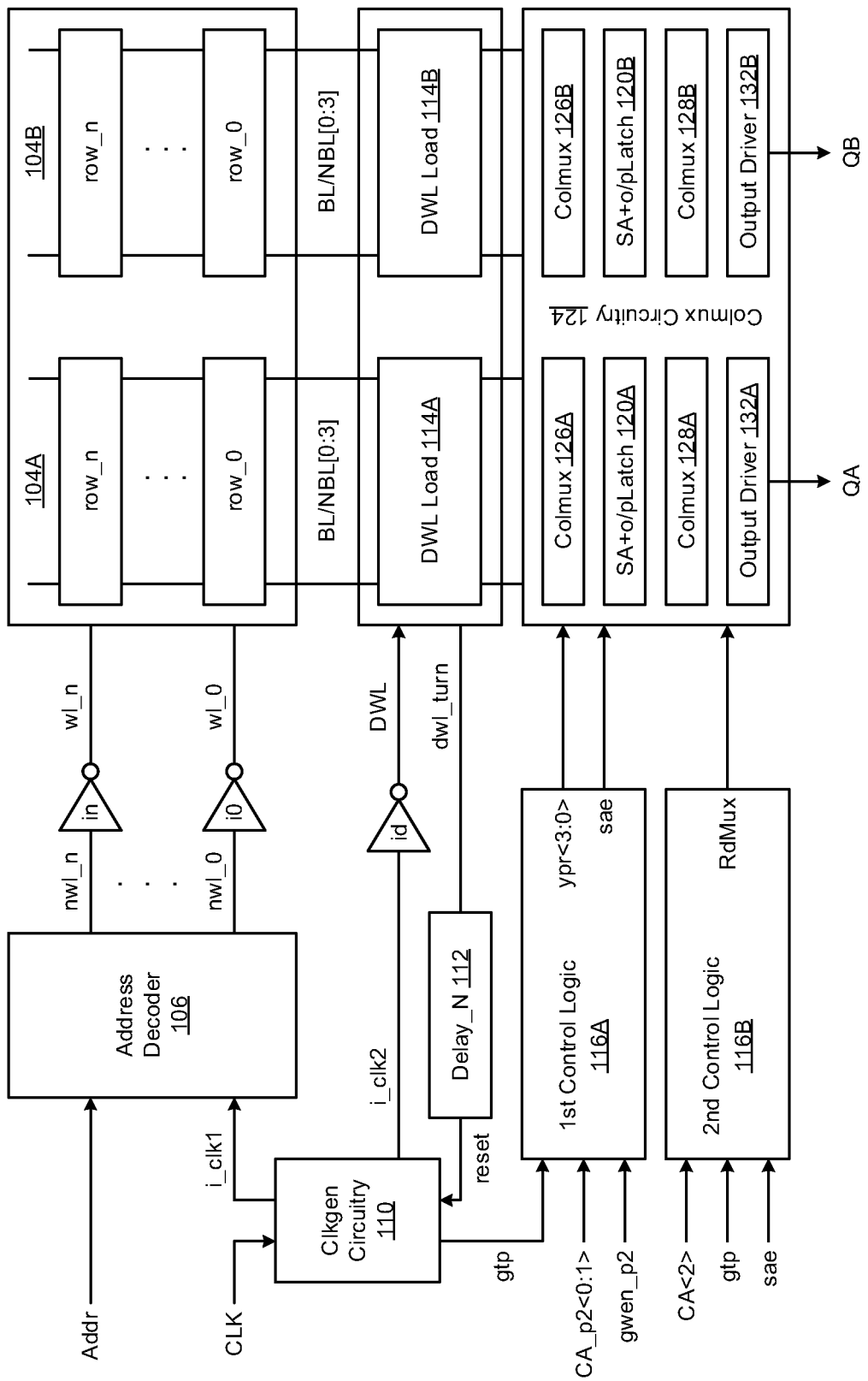
FIG. 1 illustrates a diagram of memory circuitry in accordance with various implementations described herein.

FIG. 1 illustrates a diagram 100 of memory circuitry 102 in accordance with various implementations described herein.

In various implementations, the memory circuitry 102 may be implemented as a system or a device having various integrated circuit (IC) components that are arranged and coupled together as an assemblage or combination of parts that provide for a physical circuit design and related structures. In some instances, a method of designing, providing and building the memory circuitry 102 as an integrated system or device that may involve use of various IC circuit components described herein so as to thereby implement column multiplexing schemes and techniques associated therewith. The memory circuitry 102 may be integrated with computing circuitry and related components on a single chip, and the memory circuitry 102 may be implemented in some embedded systems for electronic, mobile and Internet-of-things (IoT) applications, including sensor nodes.

As shown in FIG. 1, the memory circuitry 102 may be referred to as memory architecture having various circuitry including an address decoder 106, multiple banks of bitcell arrays 104A, 104B, clock generation circuitry 110, column multiplexer circuitry 124, and dummy wordline (DWL) circuitry associated with DWL loads 114A, 114B. The column multiplexer circuitry 124 may include column multiplexers 126A, 126B, 128A, 128B, sense amplifiers 120A, 120B, and output drivers 132A, 132B. The memory circuitry 102 may include various control circuitry, such as, e.g., first control logic 116A and second control logic 116B. The memory circuitry 102 may also include the dummy wordline (DWL) driver (id), the dummy wordline (DWL) loads 114A, 114B, and delay logic (Delay_N) 112 that are coupled to the dummy wordline DWL. The output drivers 132A, 132B may include a first output driver 132A configured to provide a first output data signal (QA) and a second output driver 132B configured to provide a second data output signal (QB).

The address decoder 106 may be coupled to the multiple banks of bitcell arrays 104A, 104B via wordline drivers (i0, . . . , in). The multiple banks of bitcell arrays 104A, 104B may include a first bitcell array 104A and a second bitcell array 104B that is different than the first bitcell arrays 104A, and each bitcell array 104A, 104B may have multiple rows of bitcells row_0, . . . , row_n. The column multiplexers (Colmux) 126A, 126B, 128A, 128B and the sense amplifiers 120A, 120B may be coupled to each of the bitcells in each of the rows of bitcells row_0, . . . , row_n via complementary bitlines (BL/NBL[0:3]). Each bitcell array 104A, 104B may use a number of inverted wordlines (e.g., nwl_0, . . . , nwl_n) that are coupled between address decoder 106 and corresponding rows of bitcells row_0, . . . , row_n for access to each of the bitcells based on selected wordlines. Also, each of the inverted wordlines nwl_0, . . . , nwl_n may have a corresponding wordline driver (e.g., inverters i0, . . . , in) coupled thereto to provide wordlines signals (e.g., wl_0, . . . , wl_n) to corresponding rows of bitcells row_0, . . . , row_n. In some instances, the sense amplifiers (SA) 120A, 120B may include output latch circuitry (o/pLatch).

The memory circuitry 102 may receive a clock signal CLK and an address signal Addr. The clock generation circuitry (Clkgen) 110 may receive the clock signal CLK and provide one or more internal clock signals, such as, e.g., a first internal clock signal i_clk1 to the address decoder 106 and also a second internal clock signal i_clk2 to the dummy wordline driver (e.g., inverter id) via the dummy wordline (DWL). The DWL loads 114A, 114B may receive the DWL signal from the DWL driver (id) and provide a DWL turn signal (dwl_turn) to the delay logic (Delay_N) 112, and also, the delay logic (Delay_N) 112 may provide a reset signal to Clkgen circuitry 110. In addition, the address decoder 106 may receive multiple signals including, e.g., the address signal Addr and the first internal clock signal i_clk1 and then access at least one inverted wordline (e.g., nwl_0, . . . , nwl_n) based on the received address signal Addr.

The memory circuitry 102 includes the first control logic 116A, which is coupled between the clock generation circuitry (Clkgen) 110 and the column multiplexers (Colmux) 126A, 126B, 128A, 128B. The first control logic 116A may receive a global timing pulse (gtp), receive a column address signal (CA_p2<0:1>), receive a global write enable signal (gwen_p2), and provide various timing and control signals (ypr<3:0>, sae) to the column multiplexers 126A, 126B, 128A, 128B and the sense amplifiers 120A, 120B. For instance, the memory circuitry 102 may utilize the first control logic 116A to provide y-mux signals (ypr<3:0>) to the column multiplexers 126A, 126B, 128A, 128B and also provide a sense amplifier enable signal (sae) to the sense amplifiers 120A, 120B.

The memory circuitry 102 may include the second control logic 116B, which is coupled to the column multiplexers (Colmux) 128A, 128B. The second control logic 116B may receive the global timing pulse (gtp), receive a column address (CA<2>), receive a the sense amplifier enable signal (sae), and provide a read multiplexer signal (RdMux) to the column multiplexers 128A, 128B. For instance, in some implementations, the memory circuitry 102 may utilize the second control logic 116B to provide the read multiplexer signal (RdMux) to the column multiplexers 128A, 128B.

In various implementations, each bitcell in the bitcell arrays 104A, 104B may be referred to as a memory cell, and each bitcell may be configured to store at least one data bit value (e.g., a data value associated with logical '0' or '1'). Each row of bitcells row_0, . . . , row_n in the bitcell arrays 104A, 104B may include any number of memory cells arranged in various configurations, such as, e.g., a two-dimensional (2D) memory array having columns and rows of multiple bitcells arranged in a 2D grid pattern. Each bitcell may be implemented with random access memory (RAM) circuitry, or some other type of volatile type memory. In some instances, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

In some instances, the memory circuitry 102 may refer to memory architecture having multiple bitcell arrays (e.g., 104A, 104B), and the memory circuitry 102 may include column multiplexer circuitry (e.g., Colmux 124) that is coupled to the memory architecture via multiple bitlines (e.g., BL/NBL<0:3>) for read access operations. Also, the column multiplexer circuitry (e.g., 124) may be configured to perform read access operations in the multiple bitcell arrays (e.g., 104A, 104B) via the bitlines (e.g., BL/NBL<0:3>) based on a sense amplifier enable signal (e.g., sae) and a read multiplexer signal (e.g., RdMux). In addition, the memory circuitry 102 may include control circuitry (e.g., 116A, 116B) that is configured to provide the read multiplexer signal (e.g., RdMux) to the column multiplexer circuitry (e.g., 124) based on a clock signal (e.g., GTP) and the sense amplifier enable signal (e.g., sae) so that the column multiplexer circuitry (e.g., 124) is able to perform the read access operations in the multiple bitcell arrays (e.g., 104A, 104B).

Figure 2A:
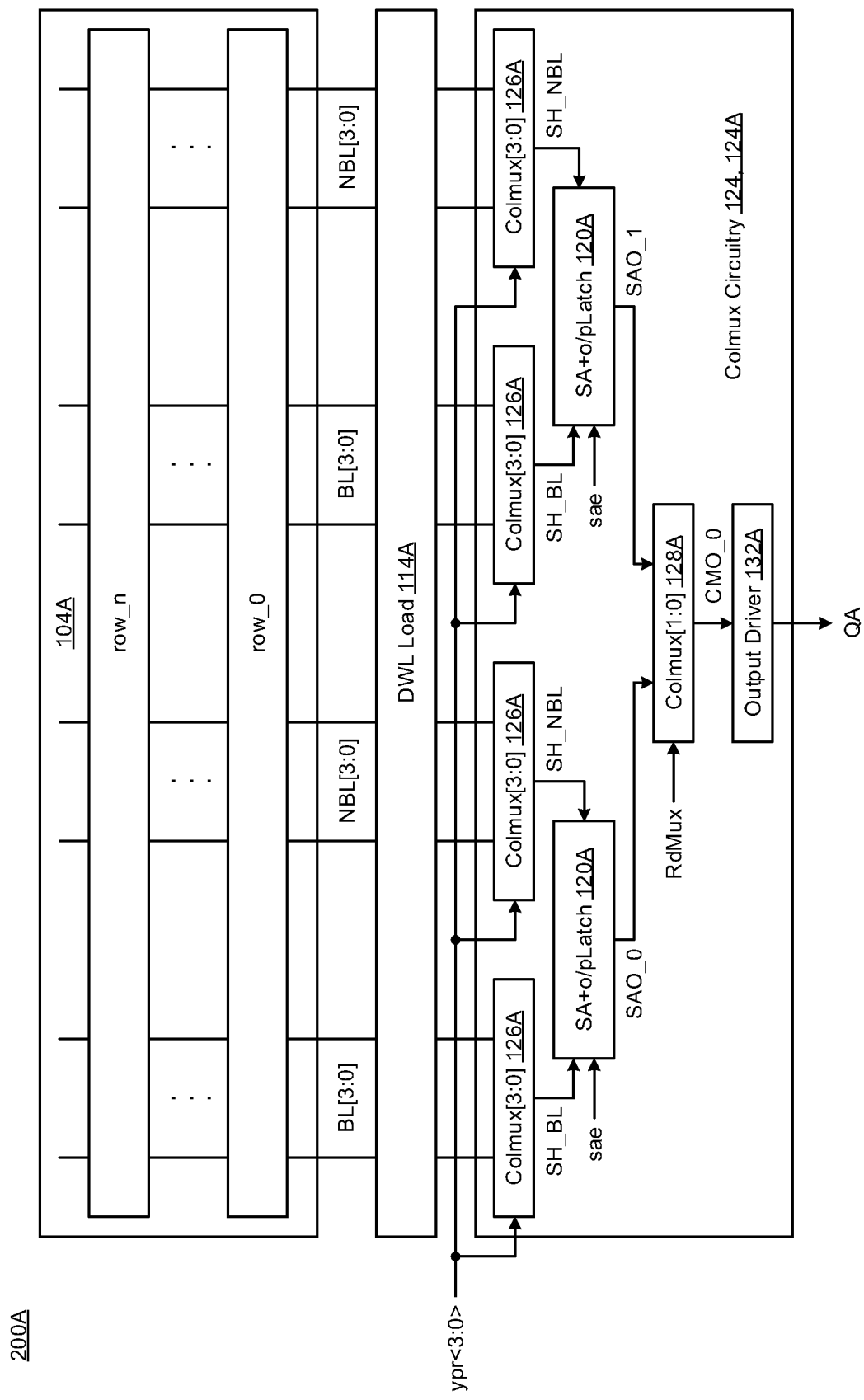
FIGS. 2A-2B illustrate diagrams of column multiplexer circuitry in accordance with various implementations described herein.
Figure 2B:
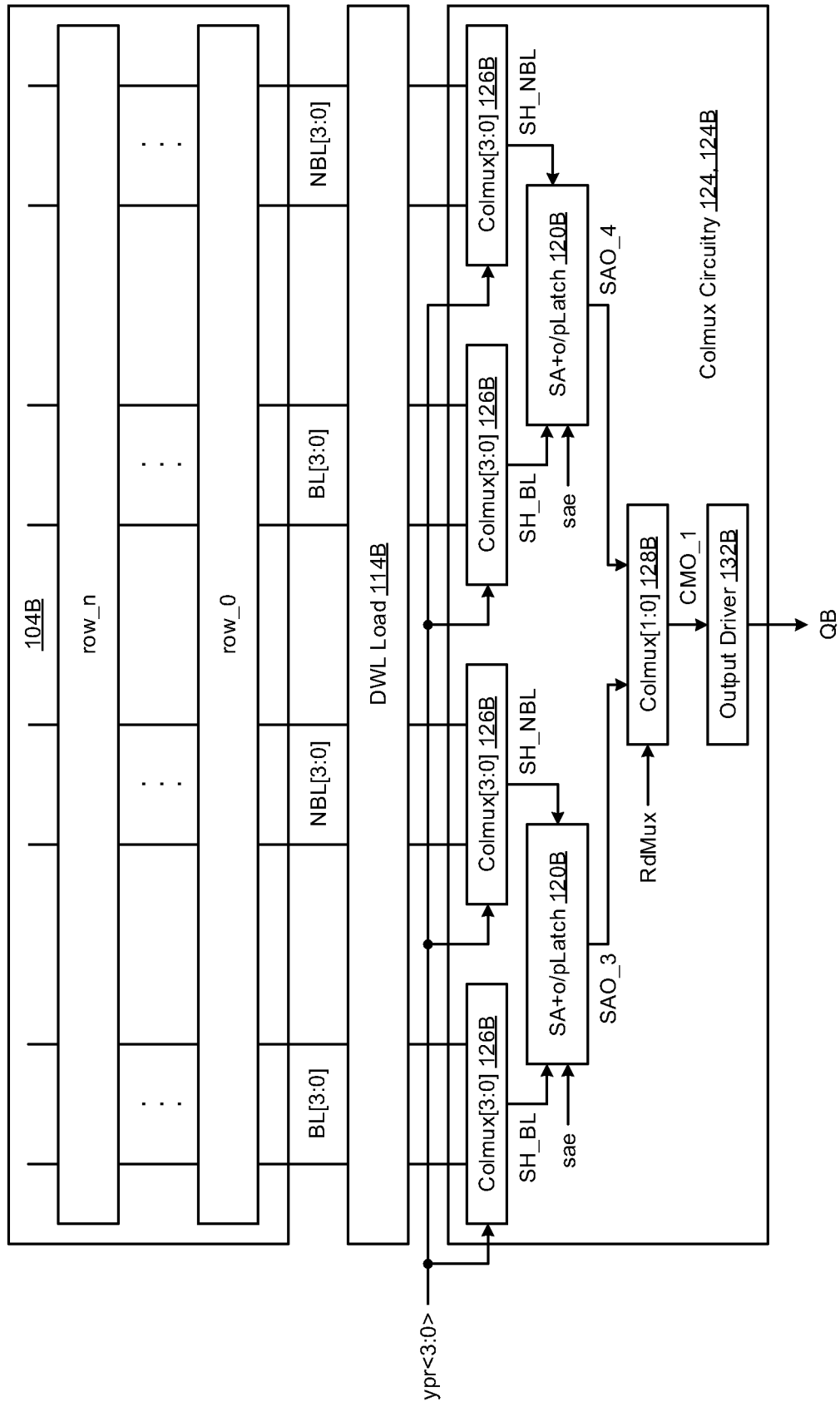

FIGS. 2A-2B illustrate diagrams of column multiplexer circuitry in accordance with various implementations described herein. In particular, FIG. 2A shows portions of the memory circuitry 102 of FIG. 1 in more detail including the first bitcell array 104A, the DWL load 114A, and the column multiplexer circuitry 124, and also, FIG. 2B shows portions of the memory circuitry 102 of FIG. 1 in more detail including the second bitcell array 104B, the DWL load 114B, and the column multiplexer circuitry 124.

In some implementations, the column multiplexer circuitry 124 includes multiple separate circuits including a first column multiplexer circuit 124A coupled to the first bitcell array 104A via the bitlines (BL[3:0] and NBL[3:0]) and a second column multiplexer circuit 124B coupled to the second bitcell array 104B via the bitlines (BL[3:0], NBL[3:0]). In some instances, the first column multiplexer circuit 124A may perform read access operations in the first bitcell array 104A via bitlines (BL[3:0], NBL[3:0]) based on the sense amplifier enable signal (sae) and the read multiplexer signal (RdMux), and also, the second column multiplexer circuit 124B may perform read access operations in the second bitcell array 104B via bitlines (BL[3:0], NBL[3:0]) based on the sense amplifier enable signal (sae) and the read multiplexer signal (RdMux).

As shown in FIG. 2A, the column multiplexer circuitry 124A includes column multiplexers 126A, 128A, sense amplifier 120A, and the first output driver 132A that are arranged and configured to receive data from the first bitcell array 104A via the bitlines (BL[3:0] and NBL[3:0]) and provide the first output signal (QA) as a first selected data output from the memory circuitry 102 in FIG. 1.

In some instances, the column multiplexer circuitry 124A may include multiple (e.g., 4) column multiplexers 126A that are coupled to corresponding bitlines (BL[3:0] and NBL[3:0]) via a first DWL load 114A. The column multiplexers 126A may receive bitline signals from the bitlines (BL[3:0], NBL[3:0]) and provide data signals (SH_BL, SH_NBL) based on a read select signal (ypr<3:0>). Also, the column multiplexer circuitry 124A may include multiple (e.g., 2) sense amplifiers 120A (with output latches) that receive the data signals (SH_BL, SH_NBL) and provide sense amplifier output signals (SAO_1, SAO_2) based on the sense amplifier enable signal (sae). The column multiplexer 128A receives sense amplifier output signals (SAO_1, SAO_2) and provides a first colmux data signal (CM)_1) to output driver 132A based on read multiplexer signal (RdMux). The first output driver 132A may be configured to receive the first colmux data signal (CMO_0) from the column multiplexer 128A and provide the first output data signal (QA).

In some instances, the first column multiplexer circuit 124A includes first column multiplexers 126A (Colmux[3:0]), first sense amplifiers 120A, first output multiplexer 128A (Colmux[1:0]), and first output driver 132A. The first column multiplexers 126A receive read data from the first bitcell array 104A via the bitlines (BL[3:0], NBL[3:0]) and provide first multiplexed signals (SH_BL, SH_NBL) to first sense amplifiers 120A. The first sense amplifiers 120A receive the first multiplexed signals (SH_BL, SH_NBL) from first column multiplexers 126A and provide first sense amplifier output signals (SAO_1, SAO_2) to the first output multiplexer 128A. The first output multiplexer 128A may receive the first sense amplifier output signals (SAO_1, SAO_2) from the first sense amplifiers 120A and provide a second multiplexed signal (CMO_0) to the first output driver 132A. The first output driver 132A receives the second multiplexed signal (CMO_0) from the first output multiplexer 132A and provides the first data output signal (QA).

In some instances, the first sense amplifiers 120A receive the sense amplifier enable signal (sae) and provide the first sense amplifier output signals (SAO_1, SAO_2) to the first output multiplexer 128A based on the sense amplifier enable signal (sae). Also, the second control logic 116B (in FIG. 1) provides the read multiplexer signal (RdMux) to the first output multiplexer 128A based on based on the clock signal (GTP) and the sense amplifier enable signal (sae).

As shown in FIG. 2B, the column multiplexer circuitry 124B includes column multiplexers 126B, 128B, sense amplifier 120B, and the second output driver 132B that are arranged and configured to receive data from the second bitcell array 104B via the bitlines (BL[3:0] and NBL[3:0]) and provide the second output signal (QB) as a second selected data output from the memory circuitry 102 in FIG. 1.

In some instances, the column multiplexer circuitry 124B may include multiple (e.g., 4) column multiplexers 126B that are coupled to corresponding bitlines (BL[3:0] and NBL[3:0]) via a second DWL load 114B. The column multiplexers 126B receive bitline signals from the bitlines (BL[3:0], NBL[3:0]) and provide data signals (SH_BL, SH_NBL) based on read select signal (ypr<3:0>). The column multiplexer circuitry 124B includes multiple (e.g., 2) sense amplifiers 120B (with output latches) that receive the data signals (SH_BL, SH_NBL) and provide sense amplifier output signals (SAO_3, SAO_4) based on the sense amplifier enable signal (sae). The column multiplexer 128B receives sense amplifier output signals (SAO_3, SAO_4) and provides a second colmux data signal (CMO_1) to output driver 132B based on read multiplexer signal (RdMux). The second output driver 132B may be configured to receive the second colmux data signal (CMO_1) from the column multiplexer 128B and provide the second output data signal (QA).

In some instances, the second column multiplexer circuit 124B includes second column multiplexers 126B (Colmux [3:0]), second sense amplifiers 120B, second output multiplexer 128B (Colmux[1:0]), and second output driver 132B. The second column multiplexers 126B receive read data from the second bitcell array 104B via the bitlines (BL[3:0], NBL[3:0]) and provide second multiplexed signals (SH_BL, SH_NBL) to second sense amplifiers 120B. The second sense amplifiers 120B receive second multiplexed signals (SH_BL, SH_NBL) from second column multiplexers 126B and provide second sense amplifier output signals (SAO_3, SAO_4) to the second output multiplexer 128B. The second output multiplexer 128B may receive second sense amplifier output signals (SAO_3, SAO_4) from second sense amplifiers 120B and provide a second multiplexed signal (CMO_1) to the second output driver 132B. The second output driver 132B may receive the second multiplexed signal (CMO_1) from the second output multiplexer 132B and provide the second data output signal (QB).

In some instances, the second sense amplifiers 120B may receive the sense amplifier enable signal (sae) and then provide the second sense amplifier output signals (SAO_3, SAO_4) to the second output multiplexer 128B based on the sense amplifier enable signal (sae). Also, the second control logic 116B (in FIG. 1) provides the read multiplexer signal (RdMux) to the second output multiplexer 128B based on based on the clock signal (GTP) and the sense amplifier enable signal (sae).

Figure 3:
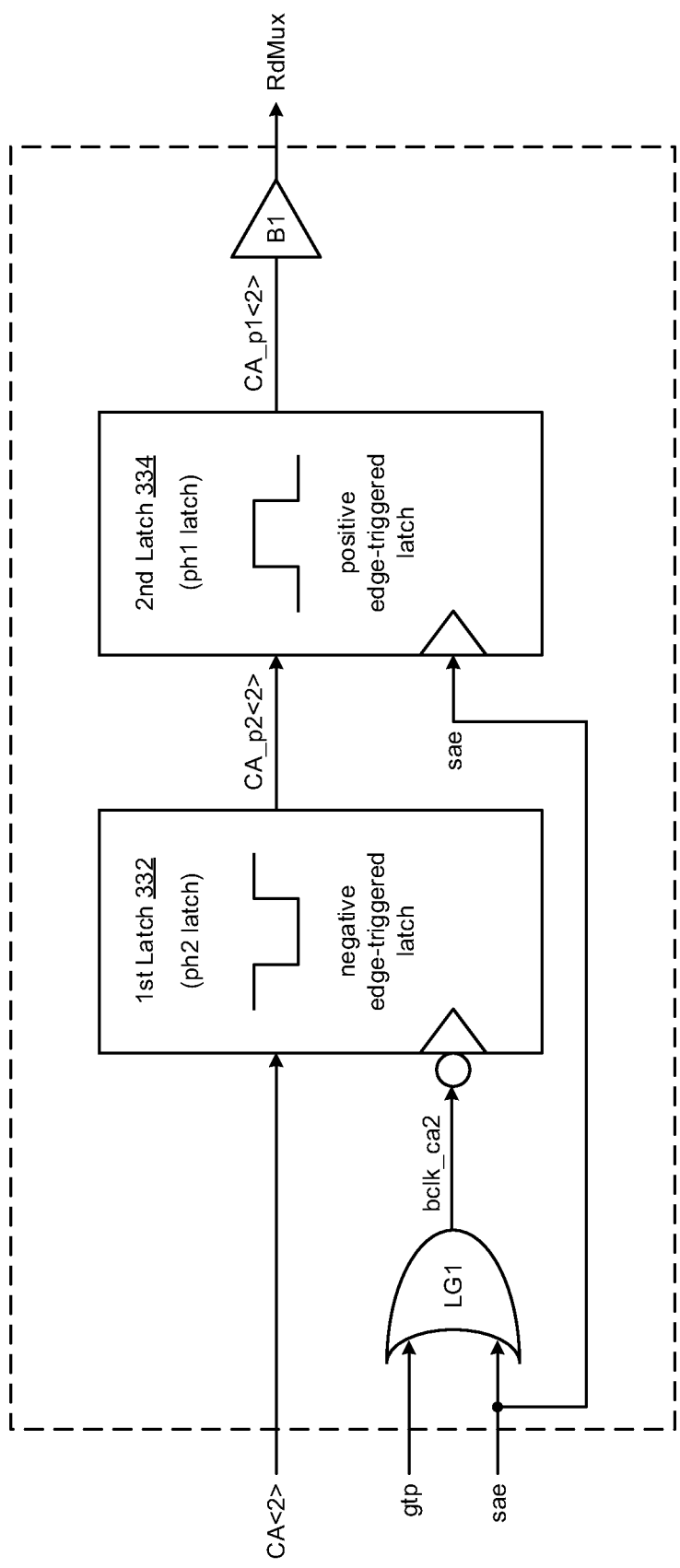
FIG. 3 illustrates a diagram of control logic circuitry in accordance with various implementations described herein.

FIG. 3 illustrates a diagram 300 of control logic circuitry 116B in accordance with various implementations described herein. In this instance, the control logic circuitry 116B refers to the second control logic 116B in FIG. 1.

As shown in FIG. 3, the control logic circuitry 116B may receive the column address (CA<2>), and the control logic circuitry 116B may provide the read multiplexer signal (RdMux) to the column multiplexer circuitry 124 based on receiving the clock signal (gtp), the sense amplifier enable signal (sae), and the column address (CA<2>) so that the column multiplexer circuitry 124 is able to perform the read access operations in the multiple bitcell arrays 104A, 104B via the bitlines (BL[3:0], NBL[3:0]). In some instances, the clock signal may refer to the global timing pulse (gtp).

In some implementations, the control logic circuitry 116B may include various components including, e.g., a first latch 332 (e.g., ph2 latch), a second latch 334 (e.g., ph1 latch), an input logic gate (LG1), and an output buffer (B1). The input logic gate (LG1) may receive the clock signal (gtp), receive the sense amplifier enable signal (sae), and then provide a buffered clock signal (bclk_ca2) to the first latch 332. The input logic gate (LG1) may be an OR gate; however, various other logics gates may be used that provide similar results. The first latch 332 may refer to a ph2 latch that is configured to operate as a negative edge-triggered latch, and the second latch 334 may refer to a ph1 latch that is configured to operate as a positive edge-triggered latch. The first latch 332 may receive the buffered clock signal (bclk_ca2), receive the column address (CA<2>) at an inverting clock input, and provide a first latched signal (CA_p2<2>) to the second latch 334. The second latch 334 receives the first latched signal (CA_p2<2>), receives the sense amplifier enable signal (sae) at a non-inverting clock input, and then provides a second latched signal (CA_p1<2>) to the output buffer (B1). The output buffer (B1) may receive the second latched signal (CA_p1<2>) and provide the read multiplexer signal (RdMux) as an output control signal to the column multiplexer circuitry 124.

In some instances, the control logic circuitry 116B may refer to a control circuit having input logic (e.g., LG1) that receives a global timing pulse (gtp), receives a sense amplifier enable signal (sae), and provides a clock signal (bclk_ca2). The control circuit may have first latch logic (e.g., 332) that receives the clock signal (bclk_ca2) from the input logic (e.g., LG1), receives a column address signal (CA<2>), and provides a first latched signal (CA_p2<2>). Also, the control circuit may have second latch logic 334 that receives the first latched signal (CA_p2<2>) from the first latch logic (e.g., 332), receives the sense amplifier enable signal (sae), and then provides a second latched signal (CA_p1<2>). Further, the control circuit may have output logic (e.g., B1) that receives the second latched signal (CA_p1<2>) from the second latch logic (e.g., 334) and provides a read multiplexer signal (RdMux) to column multiplexer circuitry (e.g., 124 in FIG. 1) for performing memory access operations in multiple bitcell arrays (e.g., 104A, 104B).

Also, in some instances, the column multiplexer circuitry (e.g., 124) may be coupled to the multiple bitcell arrays (e.g., 104A, 104B) via bitlines (e.g., BL[3:0], NBL[3:0]) for performing the memory access operations, and the column multiplexer circuitry (e.g., 124) may perform the memory access operations in the multiple bitcell arrays (e.g., 104A, 104B) via the bitlines (e.g., BL[3:0], NBL[3:0]) based on the sense amplifier enable signal (sae) and the read multiplexer signal (RdMux).

FIG. 4 illustrates a waveform diagram 400 of multiplexer timing signals 402 in accordance with various implementations described herein. In this implementation, the multiplexer timing signals 402 refer to mux8 waveforms for a mux8 instance.

As shown in FIG. 4, a rising edge of a first clock pulse (clk) triggers a rising edge of the global timing pulse (gtp). The rising edge of the gtp signal triggers a rising edge of the bclk signal, a rising edge of the bclk_ca2 signal and a rising edge of the sense amplifier enable signal (sae) at (1). Also, a falling edge of the sae signal triggers a falling edge of the bclk_ca2 signal at (2). Also, the rising edge of the sae signal triggers toggling of the read multiplexer signal (RdMux) at (3), and the rising edge of the RdMux signal triggers toggling of the output (Q) signal at (4).

In some instances, at (1), the rising edge of the blck_ca2 signal will ensure that there is no impact on ca[2] hold time as the rising edge will be controlled through the gtp signal. Also, at (2), the falling edge of the bclk_ca2 signal will ensure that the ph2 latch opens when the ph1 latch closes to thereby ensure that there is no ihold violation. Also, at (3), the ph1 latch will open when the sae signal goes high, and the ph1 latch will close when the sae signal goes low. Further, at (4), toggling of the Q signal will be controlled through sae gating of the ph1 flop, which will ensure that the rdmux signal does not toggle before the sae signal arrives, which may simplify configuration of the logic and may also save power and timing at the system-on-a-chip (SoC) level.

FIG. 5 illustrates a block diagram 500 of multi-bank memory circuitry 502 in accordance with various implementations described herein.

In various implementations, the memory circuitry 502 may be implemented as a system or a device having various integrated circuit (IC) components that are arranged and coupled together as an assemblage or combination of parts that provide for a physical circuit design and related structures. In some instances, a method of designing, providing and building the memory circuitry 502 as an integrated system or device that may involve use of various IC circuit components described herein so as to thereby implement column multiplexing schemes and techniques associated therewith. The memory circuitry 502 may be integrated with computing circuitry and related components on a single chip, and the memory circuitry 502 may be implemented in some embedded systems for electronic, mobile and Internet-of-things (IoT) applications, including sensor nodes.

As shown in FIG. 5, the memory circuitry 502 may be referred to as memory architecture having various multi-bank related circuitry including a first multi-bank array 504A and a second multi-bank array 504B. In some instances, the first multi-bank array 504A may be referred to as a lower bank array having a first lower bank (Lower Bank_0) and a second lower bank (Lower Bank_1). Also, in some instances, the second multi-bank array 504B may be referred to as an upper bank array having a first upper bank (Upper Bank_2) and a second upper bank (Upper Bank_3). Thus, in some instances, the first multi-bank array 504A may refer to the first lower bank (Lower Bank_0) as a first bank array and the second lower bank (Lower Bank_1) as a second bank array, and also, the second multi-bank array may refer to the first upper bank (Upper Bank_2) as a third bank array and the second upper bank (Upper Bank_3) as a fourth bank array.

The memory circuitry 502 may include first control circuitry 526A (CTRL Lower Bank_0, Lower Bank_1) coupled to the first multi-bank array 504A for performing read access operations in the first multi-bank array 504A based on a first sense amplifier enable signal (sae_bot). The memory circuitry 502 may include second control circuitry 526B 526A (CTRL Upper Bank_2, Upper Bank_3) coupled to the second multi-bank array 504B for performing read access operations in the second multi-bank array 504B based on a second sense amplifier enable signal (sae_top). Also, the first sense amplifier enable signal (sae_bot) is derived from the second sense amplifier enable signal (sae_top).

The memory circuitry 502 includes multi-bank control circuitry 516 that provides a bank multiplexer selection signal (bank_mux_sel) to the multi-bank multiplexer circuitry 532A, 532B based on a clock signal (set_clk), a bank address (BA), and a mixed sense amplifier enable signal (sae_mixed) that is derived from the first sense amplifier enable signal (sae_bot) and the second sense amplifier enable signal (sae_top) so that the multi-bank multiplexer circuitry 532A, 532B is able to select output data (Q0, Q1) from the first multi-bank array 504A or the second multi-bank array 504B during the read access operations. In some instances, the multi-bank multiplexer circuitry 516 may include a first multi-bank output multiplexer 532A and a second multi-bank output multiplexer 532B, and the first bank array (Lower Bank_0) and the third bank array (Upper Bank_2) are coupled to the first multi-bank output multiplexer 532A, and also, the second bank array (Lower Bank_1) and the fourth bank array (Upper Bank_3) are coupled to the second multi-bank output multiplexer 532B.

In some instances, the output data (Q0, Q1) may include first output data (Q0) and second output data (Q1). The multi-bank control circuitry 516 may provide the bank multiplexer selection signal (bank_mux_sel) to the first multi-bank output multiplexer 532A for selection of the first output data (Q0) from the first bank array (Lower Bank_0) or the third bank array (Upper Bank_2). Also, the multi-bank control circuitry 516 may provide the bank multiplexer selection signal (bank_mux_sel) to the second multi-bank output multiplexer 532B for selection of the second output data (Q1) from the second bank array (Lower Bank_1) or the fourth bank array (Upper Bank_3).

In some instances, in reference to the first memory array 504A, the memory circuitry 502 may have wordline driver circuitry 522A, 522B including first wordline driver circuitry 522A (WLD Lower Bank_0) coupled to the first bank array (Lower Bank_0) and second wordline driver circuitry 522B (WLD Lower Bank_1) coupled to the second bank array (Lower Bank_1). The memory circuitry 502 may have first multiplexer circuitry 528A (MUX Lower Bank_0 and Lower Bank_1).

In some instances, in reference to the second memory array 504B, the memory circuitry 502 may have wordline driver circuitry 524A, 524B including third wordline driver circuitry 524A (WLD Upper Bank_2) coupled to the third bank array (Upper Bank_2) and fourth wordline driver circuitry 524B (WLD Upper Bank_3) coupled to the fourth bank array (Upper Bank_3). The memory circuitry 502 may have second multiplexer circuitry 528B (MUX Upper Bank_2 and Upper Bank_3).

Figure 6:
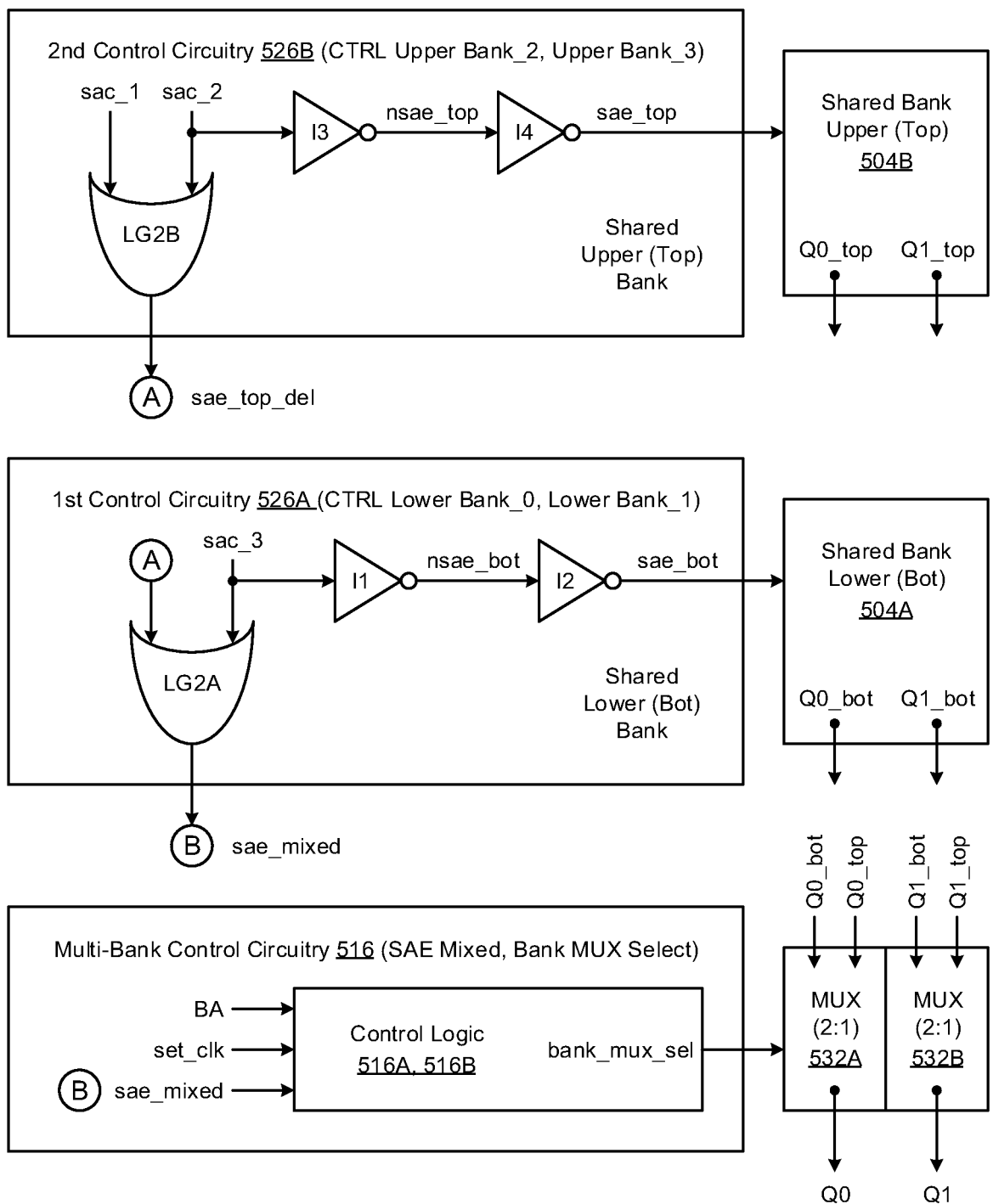
FIG. 6 illustrates a diagram of multi-bank control circuitry in accordance with various implementations described herein.

FIG. 6 illustrates a schematic diagram 600 of multi-bank control circuitry 602 in accordance with various implementations described herein. In the schematic diagram 600 of FIG. 6, the multi-bank control circuitry 602 shows more detailed views of various components of the multi-bank control circuitry 502 in FIG. 5.

As shown in FIG. 6, the first control circuitry 526A (CTRL Lower Bank_0, Lower Bank_1) may include various logic gates including a first logic gate (LG2A, e.g., an OR gate), a second logic gate (I1, e.g., an inverter), and a third logic gate (I2, e.g., another inverter). The second control circuitry 526B (CTRL Upper Bank_2, Upper Bank_3) may include various logic gates including a first logic gate (LG2B, e.g., an OR gate), a second logic gate (I3, e.g., an inverter), and a third logic gate (I4, e.g., another inverter). Also, the multi-bank control circuitry 516 may include control logic 516A, 516B.

In some implementations, the second control circuitry 526B may be referred to as shared control circuitry for the upper (top) bank array 504B. In reference to the second control circuitry 526B, the logic gate (LG2B) may receive multiple sense amplifier control signals (sac_1, sac_2) and then provide an output control signal (sae_top_del) to the first control circuitry 526A. The logic gate (I3) receives the control signal (sac_2) and provides a sense amplifier enable signal (nsae_top) to the logic gate (I4), and also, the logic gate (I4) receives the sense amplifier enable signal (nsae_top) and provides another sense amplifier enable signal (sae_top) to the shared upper bank (Top) 504B. Also, the shared upper bank (Top) 504B may receive the sense amplifier enable signal (sae_top), provide a first data output signal (Q0_top) from the first upper bank (Upper Bank_2), and provide a second data output signal (Q1_top) from the second upper bank (Upper Bank_3).

In some implementations, the first control circuitry 526A may be referred to as shared control circuitry for the lower (bottom or bot) bank array 504A. In reference to the first control circuitry 526A, the logic gate (LG2A) may receive multiple sense amplifier control signals (sae_top_del, sac_3) and provide an output control signal (sae_mixed) to the multi-bank control circuitry 516. The logic gate (I1) receives the control signal (sac_3) and provides a sense amplifier enable signal (nsae_bot) to the logic gate (I2), and the logic gate (I2) receives the sense amplifier enable signal (nsae_bot) and provides another sense amplifier enable signal (sae_bot) to the shared lower bank (Bot) 504A. The shared lower bank (Bot) 504A may receive the sense amplifier enable signal (sae_bot), provide a first data output signal (Q0_bot) from the first lower bank (Lower Bank_0), and provide a second data output signal (Q1_bot) from the second lower bank (Lower Bank_1).

In some implementations, the memory circuitry 602 may include the multi-bank control circuitry 516 that provides the bank multiplexer selection signal (bank_mux_sel) to the multi-bank multiplexer circuitry 532A, 532B based on the clock signal (set_clk), the bank address (BA), and the mixed sense amplifier enable signal (sae_mixed), which is derived from the sense amplifier enable signals (sae_top, sae_bot). In this instance, the multi-bank multiplexer circuitry 532A, 532B is able to select output data (Q0, Q1) from the output data signals (Q0_bot, Q1_bot) of the first multi-bank array 504A or from the output data signals (Q0_top, Q1_top) of the second multi-bank array 504B during read access operations. The multi-bank multiplexer circuitry 516 may be coupled to the first multi-bank output multiplexer 532A and the second multi-bank output multiplexer 532B.

In some implementations, the first bank array (Lower Bank_0) provides the first lower data signal (Q0_bot) to the first multi-bank output multiplexer 532A, and the third bank array (Upper Bank_2) provides the first upper data signal (Q0_top) to the first multi-bank output multiplexer 532A. Also, the second bank array (Lower Bank_1) provides the second lower data signal (Q1_bot) to the second multi-bank output multiplexer 532B, and the fourth bank array (Upper Bank_3) provides the second upper data signal (Q1_top) to the second multi-bank output multiplexer 532B. Further, in this instance, the multi-bank multiplexer circuitry 532A, 532B is configured to select the output data (Q0, Q1) from the output data signals (Q0_bot, Q1_bot, Q0_top, Q1_top) based on the bank multiplexer selection signal (bank_mux_sel) during read access operations.

Figure 7B:
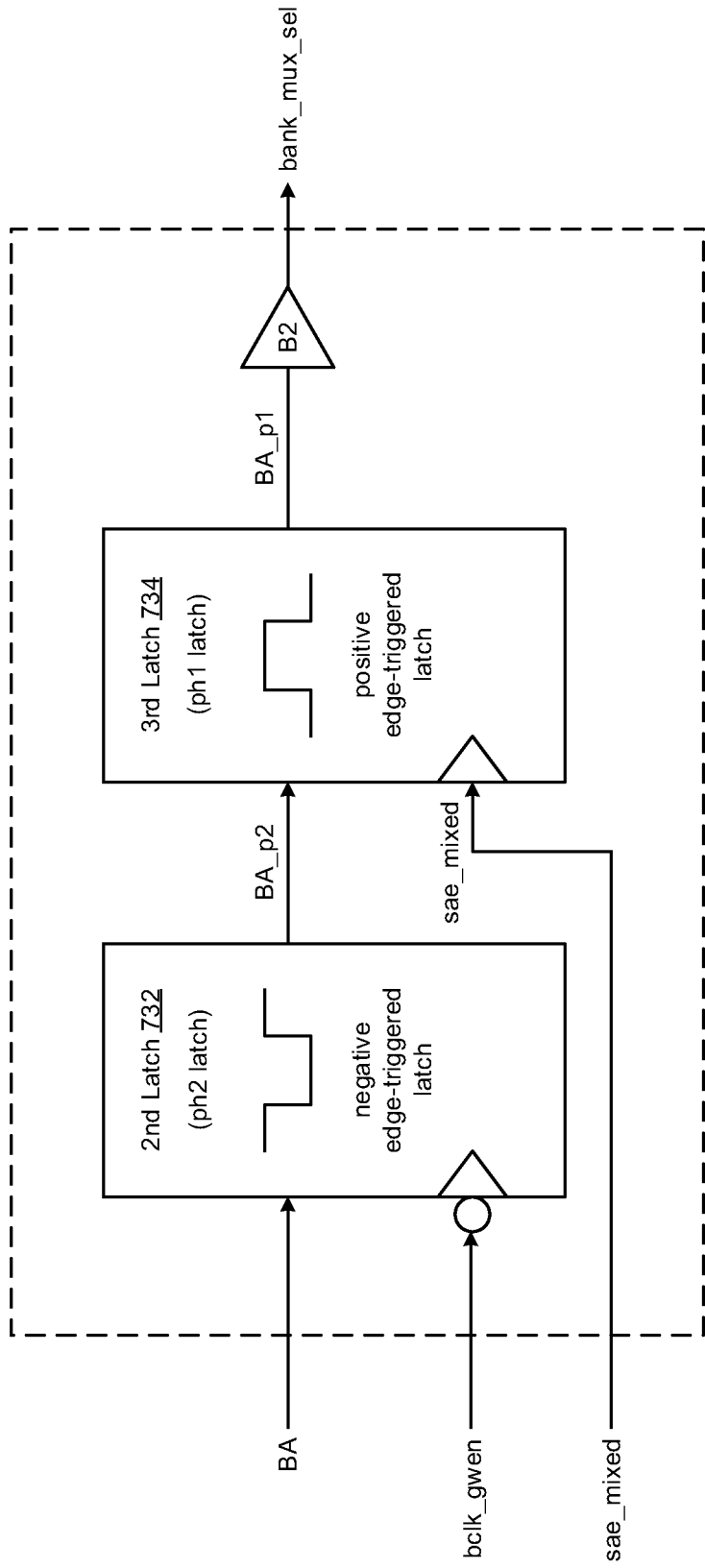

FIGS. 7A-7B illustrate various diagrams of control logic circuitry in accordance with various implementations described herein. In some instances, as described herein, the multi-bank control circuitry 516 in FIGS. 5-6 may include multiple control logic 516A, 516B. In particular, FIG. 7A shows a diagram 700A of control logic circuitry 516A, and FIG. 7B shows a diagram 700B of control logic circuitry 516B.

As shown in FIG. 7A, the control logic circuitry 516A may include set clock logic circuitry 720 and a latch 730. In some instances, the set clock logic circuitry 720 may include multiple logic gates that are arranged and configured to receive multiple input signals (e.g., clk_ext, gwen, ncen) and provide multiple output signals (e.g., bclk_ext, set_clk) based on the multiple input signals. For instance, the set clock logic circuitry 720 may include a first logic gate (inverter I5) that receives an external clock signal (clk_ext) and provides an inverted external clock signal (nclk_ext) to a second logic gate (inverter I6). The second logic gate (I6) may receive the inverted external clock signal (nclk_ext) and provide a buffered external clock signal (bclk_ext). The set clock logic circuitry 720 may include a third logic gate (LG3, e.g., NAND gate) that receives the global write enable signal (gwen), receives an inverted column enable signal (ncen), and provides an output signal (out_1) to a fourth logic gate (LG4, e.g., NOR gate). The fourth logic gate (LG4) receives the inverted external clock signal (nclk_ext), receives the output signal (out_1), and provides a set clock signal (set_clk).

As shown in FIG. 7A, the control logic circuitry 516A may include a first latch 730 that may be configured to receive the set clock signal (set_clk) at a first input, receive the sae_mixed signal at a second input, and provide an output signal (bclk_gwen) based on the set_clk signal and the sae_mixed signal. In some implementations, the first latch 730 may refer to an SR latch having the first input as a set (S) input and the second input as a reset (R) input. Also, in some implementations, the first latch 730 (e.g., SR latch) may be configured to provide the output signal (bclk_gwen) as a mixed signal related to the buffered clock signal (bclk) and/or the global write enable signal (gwen).

As shown in FIG. 7B, the control logic circuitry 516B may include one or more latches and one or more logic gates. In some instances, the control logic circuitry 516B may include multiple logic gates that are arranged and configured to receive multiple input signals (e.g., BA, bclk_gwen, sae_mixed) and provide one or more output signals (e.g., bank_mux_sel) based on the multiple input signals. For instance, the control logic circuitry 516B may include a second latch 732 (e.g., ph2 latch), a third latch 734

(e.g., ph1 latch), and a fifth logic gate (B2, e.g., a second output buffer). The second latch 732 may refer to a ph2 latch that is configured to operate as a negative edge-triggered latch, and the third latch 734 may refer to a ph1 latch that is configured to operate as a positive edge-triggered latch. In some implementations, the second latch 732 may receive the bank address signal (BA) at an input, receive the bclk_gwen signal at an inverting clock input, and provide a first latched bank address signal (BA_p2). The third latch 734 may receive the first latched bank address signal (BA_p2) at an input, receive the sae_mixed signal at a non-inverting clock input, and provide a second latched bank address signal (BA_p2) to the fifth logic gate (B2, e.g., second output buffer). In this instance, the second output buffer (B2) receives the second latched bank address signal (BA_p2) from the third latch 734 and provides the bank multiplexer selection signal (bank_mux_sel).

In some implementations, in reference to FIGS. 5-6 and 7A-7B, the multi-bank memory circuitry 502 refers to a multi-bank memory device having memory architecture with a first multi-bank array 504A and a second multi-bank array 504B. The multi-bank memory circuitry 502 may include first control circuitry 526A coupled to the first multi-bank array 504A for performing read access operations in the first multi-bank array 504A based on one or more sense amplifier enable signals (sae_top_del, sac3). Also, the multi-bank memory circuitry 502 may include second control circuitry 526B coupled to the second multi-bank array 504B for performing read access operations in the second multi-bank array 504B based on one or more sense amplifier enable signals (e.g., sac1, sac2). In some instances, the sense amplifier enable signal (sae_top_del) may be derived from the sense amplifier enable signals (sac1, sac2). Also, the multi-bank memory circuitry 502 may include multi-bank control circuitry 516 that provides the bank multiplexer selection signal (bank_mux_sel) to multi-bank multiplexer circuitry 532A, 532B based on the clock signal (set_clk), the bank address (BA), and/or the mixed sense amplifier enable signal (sae_mixed) that is derived from one or more of the sense amplifier enable signals (sac1, sac2, sac3, sae_top_del) so that the multi-bank multiplexer circuitry 532A, 532B is able to select output data (Q0, Q1) from the first multi-bank array 504A or the second multi-bank array 504B during the read access operations.

Also, in reference to FIGS. 7A-7B, the multi-bank control circuitry 516 may include the first latch 730 (e.g., SR latch), the second latch 732 (e.g., Data latch), the third latch 734 (e.g., Data latch), and the output buffer (B2). The first latch 730 may receive the clock signal (set_clk), receive the mixed sense amplifier enable signal (sae_mixed), and provide the buffered clock signal (bclk_gwen) to the second latch 732. The second latch 732 may receive the buffered clock signal (bclk_gwen), receive the bank address (BA), and provide the first latched signal (BA_p2) to the third latch 734. The third latch 734 may receive the first latched signal (BA_p2), receive the mixed sense amplifier enable signal (sae_mixed), and provide the second latched signal (BA_p1) to the output buffer (B2). The output buffer (B2) may receive the second latched signal (BA_p1) and provide the bank multiplexer selection signal (bank_mux_sel) as an output control signal to the multi-bank multiplexer circuitry 532A, 532B.

In some implementations, the first latch 730 may refer to a set-reset (SR) latch, and the second latch may refer to a first data latch (D latch or data flip-flop (DFF)), and the third latch may refer to a second data latch (D latch or data flip-flop (DFF)). Also, in some implementations, the multi-bank control circuitry 516, 516A, 516B may include the set clock logic circuitry 720 having multiple logic gates that are arranged and configured to receive the external clock signal (clk_ext), receive the global write enable signal (gwen), receive the column enable signal (ncen), and provide the clock signal (e.g., the set clock signal (set_clk)) to the first latch 730.

Figure 8:
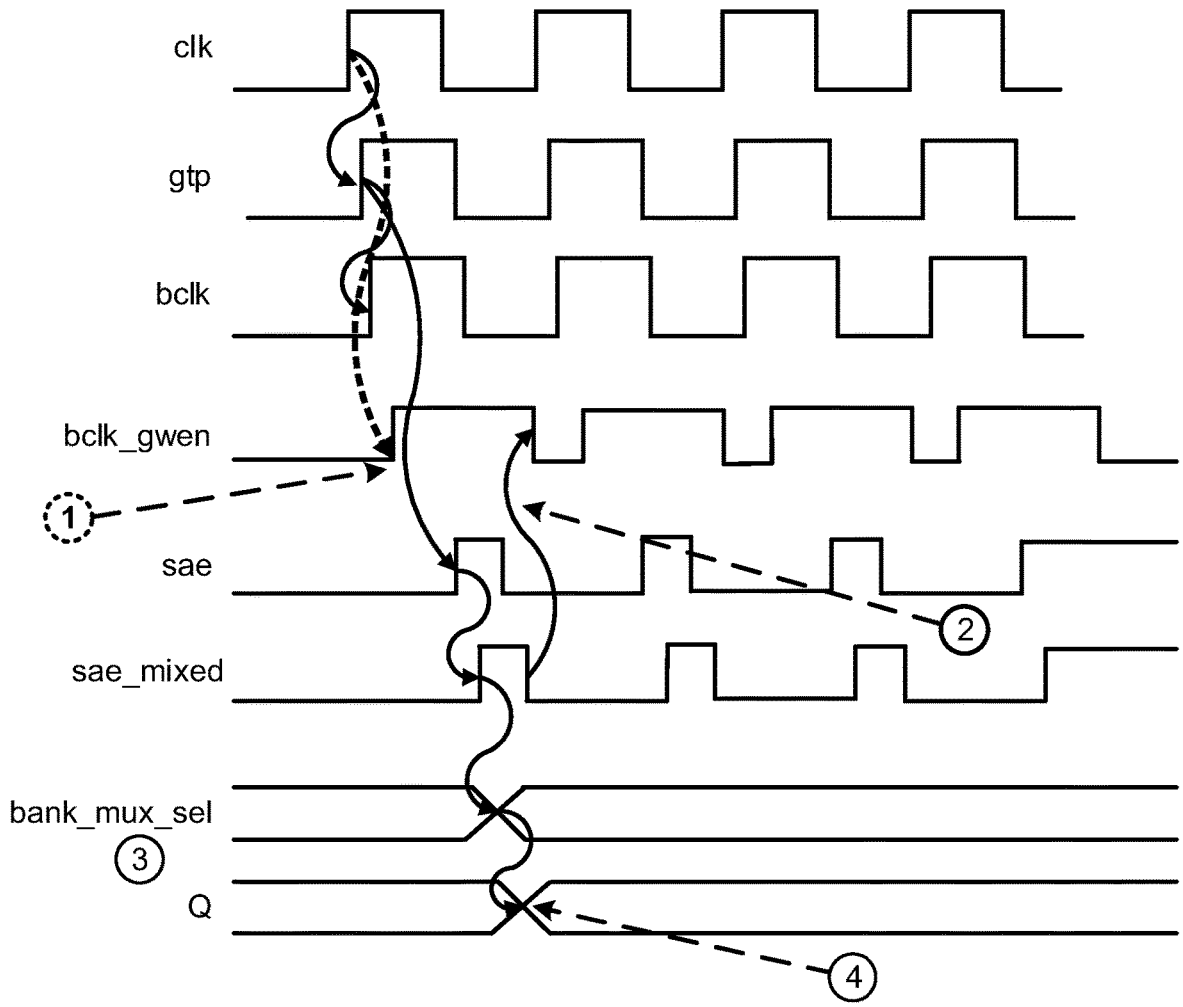
FIG. 8 illustrates a waveform diagram of multiplexer timing for multi-bank memory circuitry in accordance with various implementations described herein.

FIG. 8 illustrates a waveform diagram 800 of multiplexer timing signal 802 for multi-bank memory circuitry in accordance with implementations described herein. In this implementation, the multiplexer timing signals 802 may refer to multi-bank waveforms for the multi-bank memory circuitry 502 in reference to FIG. 5.

As shown in FIG. 8, a rising edge of a first clock pulse (clk) triggers a rising edge of the global timing pulse (gtp), and the rising edge of the global timing pulse (gtp) triggers a rising edge of the buffered clock pulse (bclk). The rising edge of the clock pulse (clk) also triggers a rising edge of the bclk_gwen pulse signal, and the rising edge of the gtp signal triggers a rising edge of the sae pulse signal. The rising edge of the sae pulse signal triggers a rising edge of the sae_mixed pulse signal, and also, a falling edge of the sae_mixed pulse signal triggers a falling edge of the bclk_gwen signal. The rising edge of the sae_mixed pulse signal triggers toggling of the bank_mux_sel signal, and also, the toggling of the bank_mux_sel signal triggers toggling od the output data signal (Q).

In some instances, at (1), the rising edge of the blck_gwen signal will ensure that there is no impact on hold time of the bank address (BA) as the rising edge will be controlled through the external clock (clk_ext) via the SR latch 730. Also, at (2), the falling edge of the sae_mixed pulse signal will ensure that the ph2 latch 732 opens when the ph1 latch 734 closes so as to ensure that there is no ihold violation. Also, at (3), the ph1 latch 734 will open when the sae_mixed pulse signal goes high (i.e., rises), and the ph1 latch 734 will close when the sae pulse signal goes low (i.e., falls). Also, at (4), toggling of the output signal (Q) may be controlled through sae_mixed gating of the ph1 latch 734, which will ensure that the bank_mux_sel signal does not toggle before the sae signal arrives, which simplifies the logic and saves power and timing at the SoC level.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include memory architecture having multiple bitcell arrays. The device may include column multiplexer circuitry coupled to the memory architecture via multiple bitlines for read access operations, and the column multiplexer circuitry may perform read access operations in the multiple bitcell arrays via the bitlines based on a sense amplifier enable signal and a read multiplexer signal. The device may include control circuitry that provides the read multiplexer signal to the column multiplexer circuitry based on a clock signal and the sense amplifier enable signal so that the column multiplexer circuitry is able to perform the read access operations.

Described herein are various implementations of a control circuit. The control circuit may include input logic that receives a global timing pulse, receives a sense amplifier enable signal, and provides a clock signal. The control circuit may include first latch logic that receives the clock signal from the input logic, receives a column address, and provides a first latched signal. The control circuit may include second latch logic that receives the first latched signal from the first latch logic, receives the sense amplifier enable signal, and provides a second latched signal. The control circuit may include output logic that receives the second latched signal from the second latch logic and provides a read multiplexer signal to column multiplexer circuitry for performing memory access operations in multiple bitcell arrays.

Described herein are various implementations of a multi-bank memory device. The multi-bank memory device may include memory architecture having a first multi-bank array and a second multi-bank array. The multi-bank memory device may include first control circuitry coupled to the first multi-bank array for performing read access operations in the first multi-bank array based on a first sense amplifier enable signal. The multi-bank memory device may include second control circuitry coupled to the second multi-bank array for performing read access operations in the second multi-bank array based on a second sense amplifier enable signal that is derived from the first sense amplifier enable signal. The multi-bank memory device may include multi-bank control circuitry that provides a bank multiplexer selection signal to multi-bank multiplexer circuitry based on a clock signal, a bank address, and a mixed sense amplifier enable signal that is derived from the first sense amplifier enable signal and the second sense amplifier enable signal so that the multi-bank multiplexer circuitry is able to select output data from the first multi-bank array or the second multi-bank array during the read access operations.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
    memory architecture having multiple bitcell arrays including a first bitcell array and a second bitcell array that is separate from the first bitcell array;
    column multiplexer circuitry coupled to the multiple bitcell arrays including the first bitcell array and the second bitcell array of the memory architecture via multiple bitlines for read access operations, wherein the column multiplexer circuitry performs read access operations in the multiple bitcell arrays via the multiple bitlines based on a sense amplifier enable signal and a read multiplexer signal; and
    control circuitry that provides multiple control signals including the sense amplifier enable signal and the read multiplexer signal to the column multiplexer circuitry based on a clock signal so that the column multiplexer circuitry separately performs the read access operations in the multiple bitcell arrays including separately performing the read access operations in the first bitcell array and in the second bitcell array,
    wherein the control circuitry has a first latch that provides a first latched signal to a second latch based on a column address, the clock signal, and the sense amplifier enable signal, and
    wherein the second latch provides the read multiplexer signal as an output control signal to the column multiplexer circuitry based on the first latched signal and the sense amplifier enable signal.

2. The device of claim 1, wherein the second bitcell array is different than the first bitcell array.

3. The device of claim 2, wherein the column multiplexer circuitry includes multiple separate circuits including a first column multiplexer circuit coupled to the first bitcell array via the bitlines and a second column multiplexer circuit coupled to the second bitcell array via the bitlines.

4. The device of claim 3, wherein the first column multiplexer circuit performs the read access operations in the first bitcell array via the multiple bitlines based on the sense amplifier enable signal and the read multiplexer signal, and wherein the second column multiplexer circuit performs the read access operations in the second bitcell array via the bitlines based on the sense amplifier enable signal and the read multiplexer signal.

5. The device of claim 4, wherein the first column multiplexer circuit has first column multiplexers, first sense amplifiers, a first output multiplexer, and a first output driver, and wherein:
the first column multiplexers receive read data from the first bitcell array via the multiple bitlines and provide first multiplexed signals to the first sense amplifiers,
the first sense amplifiers receive the first multiplexed signals from the first column multiplexers and provide first sense amplifier output signals to the first output multiplexer,
the first output multiplexer receives the first sense amplifier output signals from the first sense amplifiers and provides a second multiplexed signal to the first output driver, and
the first output driver receives the second multiplexed signal from the first output multiplexer and provides a first data output signal.

6. The device of claim 5, wherein the second column multiplexer circuit has second column multiplexers, second sense amplifiers, a second output multiplexer, and a second output driver, and wherein:
the second column multiplexers receive read data from the second bitcell array via the multiple bitlines and provide third multiplexed signals to the second sense amplifiers,
the second sense amplifiers receive the second multiplexed signals from the second column multiplexers and provide second sense amplifier output signals to the second output multiplexer,
the second output multiplexer receives the second sense amplifier output signals from the second sense amplifiers and provides a fourth multiplexed signal to the second output driver, and
the second output driver receives the second multiplexed signal from the second output multiplexer and provides a second data output signal.

7. The device of claim 6, wherein:
the first sense amplifiers receive the sense amplifier enable signal and provide the first sense amplifier output signals to the first output multiplexer based on the sense amplifier enable signal, and
the control circuitry provides the read multiplexer signal to the first output multiplexer based on based on the clock signal and the sense amplifier enable signal.

8. The device of claim 7, wherein:
the second sense amplifiers receive the sense amplifier enable signal and provide the second sense amplifier output signals to the second output multiplexer based on the sense amplifier enable signal, and
the control circuitry provides the read multiplexer signal to the second output multiplexer based on based on the clock signal and the sense amplifier enable signal.

9. The device of claim 1, wherein the control circuitry receives a column address, and wherein the control circuitry provides the read multiplexer signal to the column multiplexer circuitry based on receiving the clock signal, the sense amplifier enable signal, and the column address so that the column multiplexer circuitry is able to perform the read access operations in the multiple bitcell arrays via the bitlines.

10. The device of claim 1, wherein the clock signal refers to a global timing pulse.

11. The device of claim 1, wherein:
the first latch receives the clock signal and the sense amplifier enable signal via an input logic gate, and
the second latch provides the read multiplexer signal as the output control signal to the column multiplexer circuitry via an output buffer.

12. The device of claim 1, wherein:
the control circuitry has an input logic gate,
the input logic gate receives the clock signal, receives the sense amplifier enable signal, and provides a buffered clock signal to the first latch, and
the first latch receives the buffered clock signal, receives the column address, and provides the first latched signal to the second latch.

13. The device of claim 1, wherein:
the control circuitry has an output buffer,
the second latch receives the first latched signal, receives the sense amplifier enable signal, and provides the second latched signal to the output buffer, and
the output buffer receives the second latched signal and provides the read multiplexer signal as the output control signal to the column multiplexer circuitry.

14. A device comprising:
memory architecture having multiple bitcell arrays including a first bitcell array and a second bitcell array that is separate from the first bitcell array;
column multiplexer circuitry coupled to the multiple bitcell arrays including the first bitcell array and the second bitcell array of the memory architecture via multiple bitlines for read access operations, wherein the column multiplexer circuitry performs read access operations in the multiple bitcell arrays via the multiple bitlines based on a sense amplifier enable signal and a read multiplexer signal; and
control circuitry that provides multiple control signals including the sense amplifier enable signal and the read multiplexer signal to the column multiplexer circuitry based on a clock signal so that the column multiplexer circuitry separately performs the read access operations in the multiple bitcell arrays including separately performing the read access operations in the first bitcell array and in the second bitcell array,
wherein the control circuitry receives a column address, and wherein the control circuitry provides the read multiplexer signal to the column multiplexer circuitry based on receiving the clock signal, the sense amplifier enable signal, and the column address so that the column multiplexer circuitry is able to perform the read access operations in the multiple bitcell arrays via the bitlines,
wherein the control circuitry has a first latch, a second latch, an input logic gate, and an output buffer, and wherein:
the input logic gate receives the clock signal, receives the sense amplifier enable signal, and provides a buffered clock signal to the first latch,
the first latch receives the buffered clock signal, receives the column address, and provides a first latched signal to the second latch, the second latch receives the first latched signal from the first latch, receives the sense amplifier enable signal, and provides a second latched signal to the output buffer, and the output buffer receives the second latched signal and provides the read multiplexer signal as an output control signal to the column multiplexer circuitry.

15. A control circuit, comprising:

input logic that receives a global timing pulse, receives a sense amplifier enable signal, and provides a clock signal;

first latch logic that receives the clock signal from the input logic, receives a column address, and provides a first latched signal;

second latch logic that receives the first latched signal from the first latch logic, receives the sense amplifier enable signal, and provides a second latched signal; and output logic that receives the second latched signal from the second latch logic and provides a read multiplexer signal to column multiplexer circuitry for performing memory access operations in multiple bitcell arrays.

16. The control circuit of claim 15, wherein:

the column multiplexer circuitry is coupled to the multiple bitcell arrays via multiple bitlines for performing the memory access operations, and the column multiplexer circuitry performs the memory access operations in the multiple bitcell arrays via the multiple bitlines based on the sense amplifier enable signal and the read multiplexer signal.

* * * * *